(12) United States Patent
Zhang et al.

(10) Patent No.: US 11,521,936 B2
(45) Date of Patent: Dec. 6, 2022

(54) DISPLAY SUBSTRATE AND METHOD OF MANUFACTURING THE SAME, AND DISPLAY PANEL

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhen Zhang, Beijing (CN); Xinwei Wu, Beijing (CN); Huimin Cao, Beijing (CN); Kangguan Pan, Beijing (CN); Fei Li, Beijing (CN); Yuqing Yang, Beijing (CN); Yue Wei, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 267 days.

(21) Appl. No.: 16/880,592

(22) Filed: May 21, 2020

(65) Prior Publication Data
US 2021/0066203 A1    Mar. 4, 2021

(30) Foreign Application Priority Data

Aug. 27, 2019   (CN) .......................... 201910796848.2

(51) Int. Cl.
*H01L 23/544*     (2006.01)
*G02F 1/1333*     (2006.01)
(Continued)

(52) U.S. Cl.
CPC .......... *H01L 23/544* (2013.01); *G02F 1/1345* (2013.01); *G02F 1/133345* (2013.01);
(Continued)

(58) Field of Classification Search
None
See application file for complete search history.

(56) References Cited

U.S. PATENT DOCUMENTS

2012/0293974 A1    11/2012  Asano et al.
2015/0249054 A1*   9/2015   Tian ..................... H01L 23/544
                                                           257/797
(Continued)

FOREIGN PATENT DOCUMENTS

CN    1988140 A      6/2007
CN    102789747 A    11/2012
(Continued)

OTHER PUBLICATIONS

Office Action dated Mar. 26, 2021 in counterpart CN Patent Application No. 201910796848.2, 17 pages.

*Primary Examiner* — Benjamin P Sandvik
(74) *Attorney, Agent, or Firm* — Procopio, Cory, Hargreaves & Savitch, LLP

(57) ABSTRACT

A display substrate has a display area and a peripheral area. The display substrate includes a base, a first insulating layer disposed above the base, a first alignment pattern disposed in the peripheral area on a surface of the first insulating layer facing away from the base, and a second alignment pattern disposed in the peripheral area at a side of the first insulating layer away from the base. An orthographic projection of the second alignment pattern on the base and an orthographic projection of the first alignment pattern on the base have a non-overlapping region therebetween, and the second alignment pattern is in contact with the first insulating layer in the non-overlapping region. Adhesion between the second
(Continued)

alignment pattern and the first insulating layer is greater than adhesion between the second alignment pattern and the first alignment pattern.

18 Claims, 11 Drawing Sheets

(51) Int. Cl.
*G02F 1/1345* (2006.01)
*H01L 27/32* (2006.01)

(52) U.S. Cl.
CPC ...... *H01L 27/3223* (2013.01); *H01L 27/3244* (2013.01); *G02F 1/133354* (2021.01); *G02F 2201/123* (2013.01); *H01L 2223/54426* (2013.01); *H01L 2227/323* (2013.01)

(56) References Cited

U.S. PATENT DOCUMENTS

| | | | | |
|---|---|---|---|---|
| 2017/0263564 A1* | 9/2017 | Kim | .................... | H01L 51/0012 |
| 2018/0269427 A1* | 9/2018 | Park | .................... | H01L 51/5256 |
| 2019/0123307 A1 | 4/2019 | Kim | | |
| 2019/0229175 A1 | 7/2019 | Lhee et al. | | |
| 2021/0348265 A1* | 11/2021 | Okamoto | ................ | C23C 14/54 |

FOREIGN PATENT DOCUMENTS

| | | |
|---|---|---|
| CN | 110085629 A | 8/2019 |
| KR | 20160057015 A | 5/2016 |

* cited by examiner

DISPLAY SUBSTRATE AND METHOD OF MANUFACTURING THE SAME, AND DISPLAY PANEL

CROSS-REFERENCE TO RELATED APPLICATION

This application claims priority to Chinese Patent Application No. 201910796848.2, filed on Aug. 27, 2019, which is incorporated herein by reference in its entirety.

TECHNICAL FIELD

The present disclosure relates to the field of display technologies, and in particular, to a display substrate and a method of manufacturing the same, and a display panel.

BACKGROUND

With the rapid development of display technology, various types of display devices have gradually developed, such as liquid crystal display (LCD) devices and self-luminous display devices (e.g., organic light-emitting diode (OLED) display devices).

SUMMARY

In one aspect, a display substrate is provided. The display substrate has a display area and a peripheral area. The display substrate includes: a base, a first insulating layer disposed on the base, a first alignment pattern disposed in the peripheral area on a surface of the first insulating layer facing away from the base, and a second alignment pattern disposed in the peripheral area at a side of the first insulating layer away from the base. An orthographic projection of the second alignment pattern on the base and an orthographic projection of the first alignment pattern on the base have a non-overlapping region therebetween, the second alignment pattern is in contact with the first insulating layer in the non-overlapping region, and adhesion between the second alignment pattern and the first insulating layer is greater than adhesion between the second alignment pattern and the first alignment pattern.

In some embodiments, the surface of the first insulating layer facing away from the base has a concave-convex structure.

In some embodiments, the first alignment pattern includes a first via hole, and the second alignment pattern is in contact with the first insulating layer through the first via hole.

In some embodiments, the second alignment pattern is disposed on the surface of the first insulating layer facing away from the base, and an outer boundary of the orthographic projection of the second alignment pattern on the base substantially overlaps with an outer boundary of the orthographic projection of the first alignment pattern on the base.

In some embodiments, the second alignment pattern is disposed on the surface of the first insulating layer facing away from the base, and an outer boundary of an orthographic projection of the second alignment pattern on the base substantially overlaps with an outer boundary of an orthographic projection of the first via hole on the base, or is within a range of the orthographic projection of the first via hole on the base.

In some embodiments, the second alignment pattern is disposed on a surface of the first alignment pattern facing away from the base, and an outer boundary of an orthographic projection of the second alignment pattern on the base is between a boundary of an orthographic projection of the first via hole on the base and an outer boundary of an orthographic projection of the first alignment pattern on the base.

In some embodiments, the second alignment pattern includes a third via hole, and an orthographic projection of the third via hole on the base is within a range of the orthographic projection of the first via hole on the base.

In some embodiments, the second alignment pattern covers a surface of the first alignment pattern facing away from the base and at least one side face of the first alignment pattern, and the orthographic projection of the first alignment pattern on the base is in a range of the orthographic projection of the second alignment pattern on the base.

In some embodiments, the second alignment pattern is disposed on the surface of the first insulating layer facing away from the base, and the second alignment pattern and the first alignment pattern has a gap therebetween.

In some embodiments, the second alignment pattern is disposed on the surface of the first insulating layer facing away from the base, the second alignment pattern includes a fourth via hole, and the first alignment pattern is disposed in the fourth via hole.

In some embodiments, a material of the second alignment pattern is the same as a material of the first insulating layer.

In some embodiments, the display substrate further includes a first electrode disposed in the display area. The first electrode and the first alignment pattern are disposed in a same layer and a material of the first electrode is the same as a material of the first alignment pattern.

In some embodiments, the display substrate further includes a second insulating layer. The second insulating layer and the second alignment pattern are disposed in a same layer and a material of the second insulating layer is the same as a material of the second alignment pattern.

In some embodiments, the second insulating layer includes an opening, and an orthographic projection of the opening on the base overlaps with an orthographic projection of the first electrode on the base.

In some embodiments, the display substrate further includes a pixel driving circuit disposed in the display area between the base and the first insulating layer. The first insulating layer includes at least one second via hole, and the pixel driving circuit is electrically connected to the first electrode through the at least one second via hole.

In another aspect, a display panel is provided. The display panel includes the display substrate as described above.

In yet another aspect, a method of manufacturing the foregoing display substrate is provided. The method includes: providing a base; forming a first insulating layer on the base; forming a first alignment pattern on the first insulating layer in a peripheral area; and forming a second alignment pattern on the first insulating layer in the peripheral area. The orthographic projection of the second alignment pattern on the base and the orthographic projection of the first alignment pattern on the base have the non-overlapping region therebetween, the second alignment pattern is in contact with the first insulating layer in the non-overlapping region, and the adhesion between the second alignment pattern and the first insulating layer is greater than the adhesion between the second alignment pattern and the first alignment pattern.

In some embodiments, after forming the first alignment pattern, the method further includes forming a first via hole in the first alignment pattern.

In some embodiments, a material of the second alignment pattern is the same as a material of the first insulating layer.

In some embodiments, after forming the second alignment pattern, the method further includes forming a third via hole in the second alignment pattern.

In some embodiments, after forming the first insulating layer on the base, the method further includes performing an ashing process on the first insulating layer.

In some embodiments, the method further includes forming a first electrode in the display area and the first alignment pattern simultaneously. The first electrode and the first alignment pattern are formed through a first patterning process.

In some embodiments, the method further includes forming a second insulating layer and the second alignment pattern simultaneously. The second insulating layer and the second alignment pattern are formed through a second patterning process.

BRIEF DESCRIPTION OF THE DRAWINGS

In order to describe technical solutions in the embodiments of the present disclosure more clearly, accompanying drawings to be used in some embodiments of the present disclosure will be introduced briefly. However, the accompanying drawings to be described below are merely accompanying drawings used to describe some embodiments of the present disclosure, and a person of ordinary skill in the art can obtain other drawings according to these drawings.

Figure 1A:
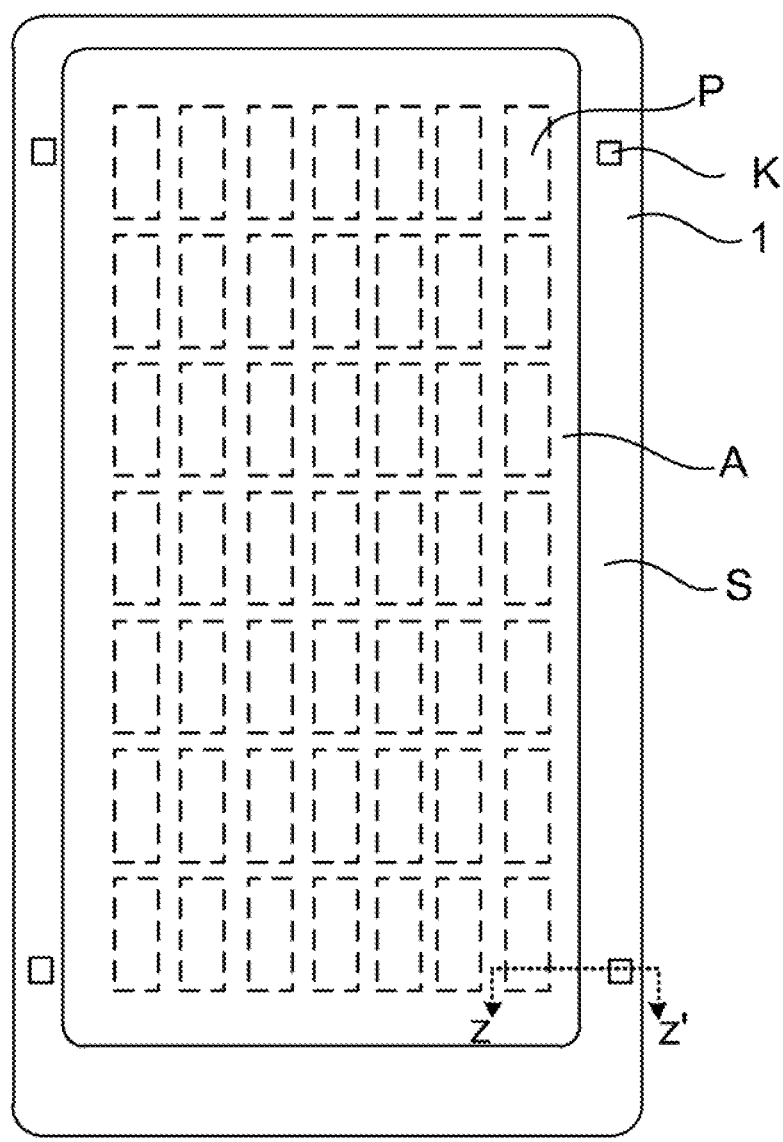
FIG. 1A is a top view of a display panel, according to some embodiments.

Exemplary embodiments are described herein with reference to sectional views and/or plan views that are idealized and exemplary drawings. In the drawings, thicknesses of layers and regions may be enlarged for clarity. Therefore, it may be conceived that shapes in the drawings can be correspondingly modified due to fabrication technologies and/or tolerances. Exemplary embodiments should not be construed as being limited to the shapes of the regions shown herein, and shall include, for example, deviations of shapes caused by fabrication. For example, a region illustrated as a rectangle will generally have curved features. Therefore, the regions illustrated in the drawings are schematic and their shapes are not intended to illustrate the actual shapes of the regions of an apparatus and are not intended to limit the scope of the exemplary embodiments.

DETAILED DESCRIPTION

Technical solutions in some embodiments of the present disclosure will be described clearly and completely with reference to accompanying drawings. Obviously, the described embodiments are merely some but not all of embodiments of the present disclosure. All other embodiments made on the basis of the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising" in the description and the claims are construed as open-ended and inclusive, i.e., "inclusive, but not limited to". In the description of the description, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment or example. In addition, the specific features, structures, materials or characteristics may be included in any one or more embodiments or examples in any suitable manner.

The term "one or more" or "at least one" used in the document, at least in part depending on the context, can be used to describe any feature, structure, or characteristic in the singular sense, or can be used to describe the combination of features, structures, or characteristics in the plural sense. At least in part depending on the context, terms such as "a" or "the" will be understood in the singular sense or in the plural sense. The word "a plurality of" herein means two or more unless otherwise specified.

The terms "first" and "second" are used for describing purposes, and cannot be construed as indicating or implying relative importance or implicitly indicating the number of technical features indicated. Thus, features defined with "first" or "second" may explicitly or implicitly include one or a plurality of the features.

It will be understood that in the description of the present disclosure, orientations or positional relationships indicated by terms "center", "upper", "lower", "front", "rear", "left", "right", "vertical", "horizontal", "top", "bottom", "inner", "outer", etc. are based on orientations or positional relationships shown in the drawings, merely to facilitate and simplify the description of the present disclosure, but not to indicate or imply that the referred devices or elements must have a particular orientation, or must be constructed or operated in a particular orientation. Therefore, they should not be construed as limitations to the present disclosure.

Some embodiments of the present disclosure provide a display panel, and the display panel is, for example, a liquid crystal display panel, an electroluminescent display panel, or a photoluminescent display panel. The electroluminescent display panel may be an organic light-emitting diode (OLED) display panel or a quantum dot light-emitting diode (QLED) display panel. The photoluminescent display panel may be a quantum dot photoluminescent display panel.

As shown in FIG. 1A, the display panel 01 includes a display substrate 1. The display substrate 1 has a display area A and a peripheral area S located at the periphery of the display area A. The peripheral area S is used for arranging wires, driving circuits (e.g., a gate driving circuit) and at least one mark K for aligning during the manufacturing process of the display substrate 1. The display area A is used for arranging a plurality of sub-pixels P.

The at least one mark K in the peripheral area S may include one mark K or a plurality of marks K, such as four marks K shown in FIG. 1A. The structures of the plurality of marks K may be the same or may be different.

Figure 3:
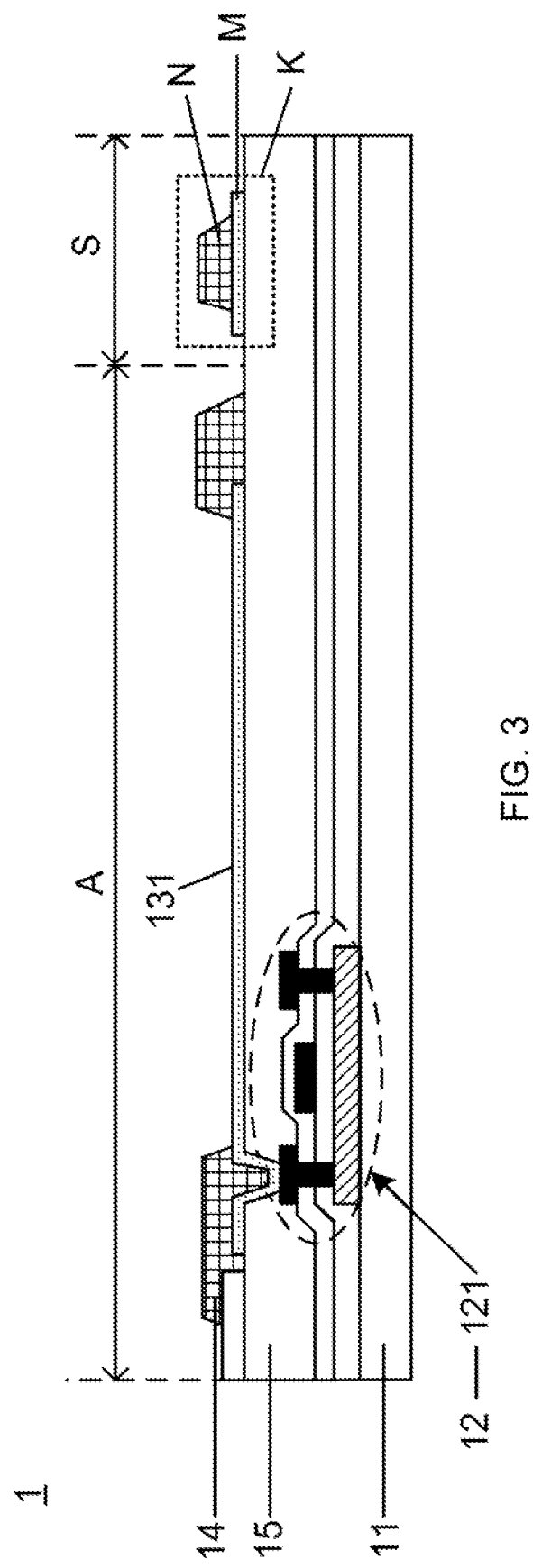
FIG. 3 is a sectional view of a display substrate along the section line z-z' in FIG. 1A.

As shown in FIG. 3, the display substrate 1 usually includes a first electrode layer. The first electrode layer includes a first electrode 131 and a first alignment pattern M. A second alignment pattern N is disposed on the first alignment pattern M, and is in contact with the first alignment pattern M. Since a surface of the first electrode layer on which the second alignment pattern N is located is very smooth, the second alignment pattern N is prone to detach from the first electrode layer. The detached second alignment pattern N is likely to move to a pixel opening region and shield the pixel opening region, thereby affecting display effect.

Figure 1B:
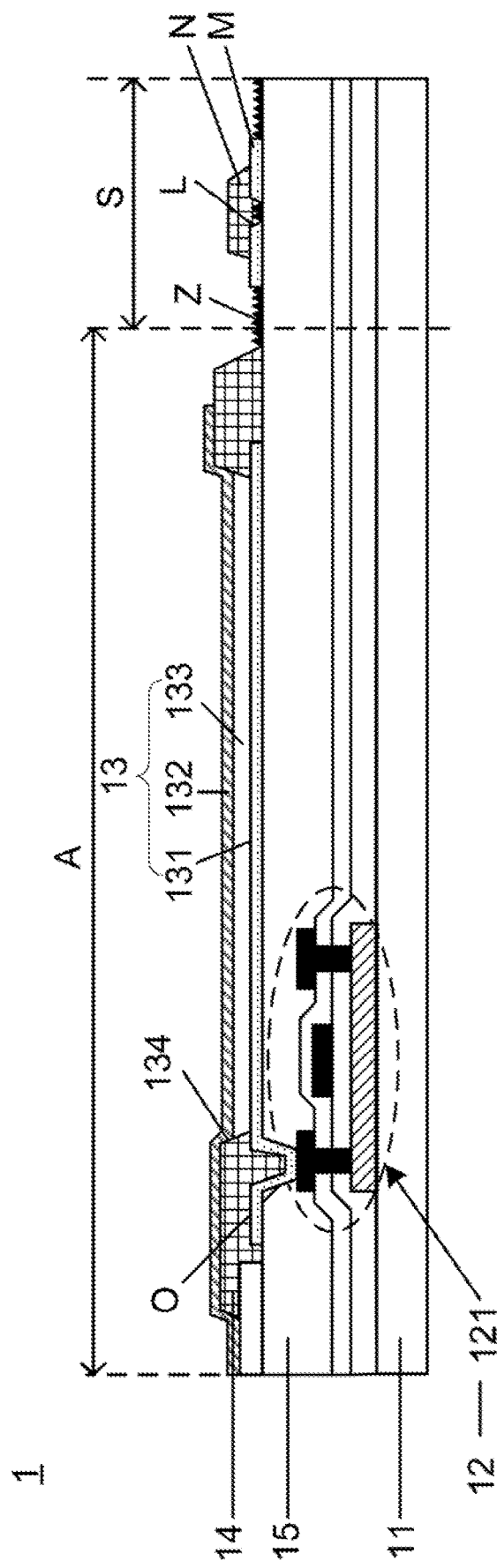
FIG. 1B is a sectional view of a display substrate along the section line z-z' in FIG. 1A, according to some embodiments.

However, in some embodiments of the present disclosure, as shown in FIG. 1B, the display substrate 1 includes: a base 11, a first insulating layer 15 disposed above the base 11, a first alignment pattern M disposed in the peripheral region S on a surface of the first insulating layer 15 facing away from the base 11, and a second alignment pattern N disposed in the peripheral region S at a side of the first insulating layer 15 away from the base 11. An orthographic projection of the second alignment pattern N on the base 11 and an orthographic projection of the first alignment pattern M on the base 11 have a non-overlapping region therebetween, and the second alignment pattern N is in contact with the first insulating layer 15 in the non-overlapping region. Adhesion between the second alignment pattern N and the first insulating layer 15 is greater than adhesion between the second alignment pattern N and the first alignment pattern M.

For example, with respect to the mark K, as shown in FIGS. 2A to 2H, at least part of the second alignment pattern N is in contact with the first insulating layer 15, and the adhesion between the second alignment pattern N and the first insulating layer 15 is greater than the adhesion between the second alignment pattern N and the first alignment pattern M. Therefore, compared with the structure in FIG. 3, the second alignment pattern N in the mark K in the embodiments of the present disclosure is not prone to detach.

Herein, adhesion refers to resistance when one of two contacted layers is subject to a vertical tensile force to separate from the other one. The adhesion may be measured by physical or chemical means. In addition, the first alignment pattern M and the second alignment pattern N may be any patterns for aligning during the manufacturing process of the display substrate 1.

The base 11 may be a base with a single-layer structure, such as a glass base. Or, the base 11 may be a base with one or more layers thereon.

It will be noted that FIG. 1B only used to schematically illustrate a structure of a part of the display substrate 1, and will not adversely limit the structure of the entire display substrate 1.

Figure 2A:
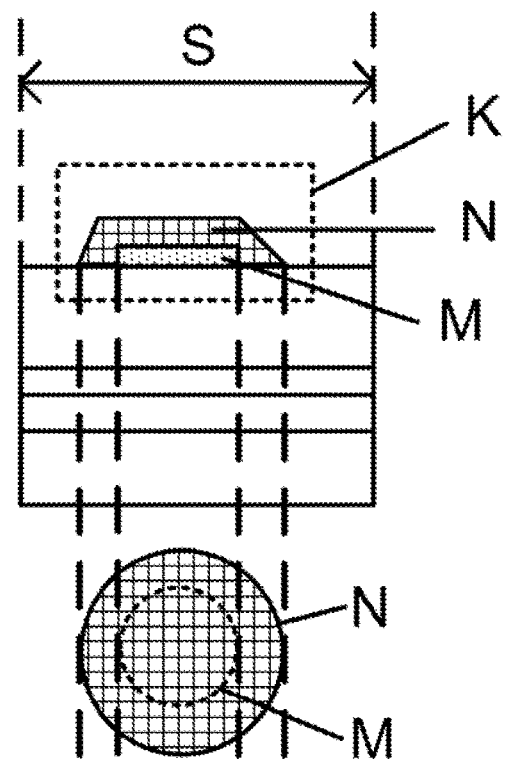
FIG. 2A shows a top view of the mark in FIG. 1A and a sectional view of a part of a display substrate along section line z-z' in FIG. 1A, according to some embodiments.
Figure 2B:
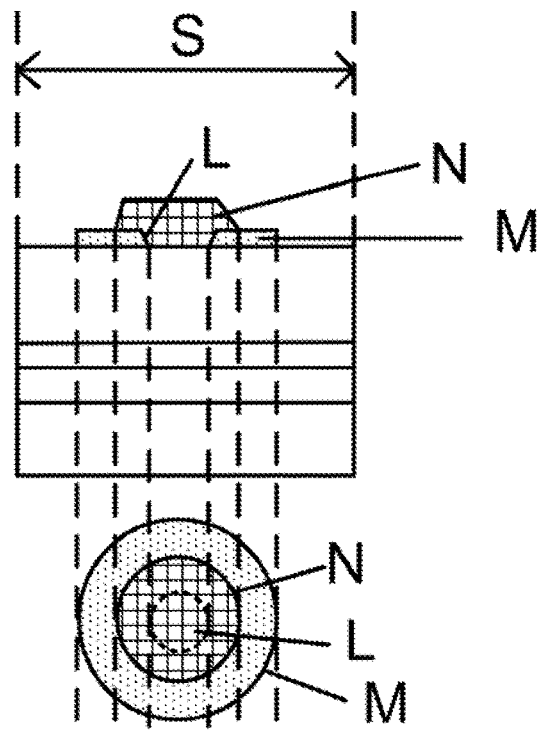
FIG. 2B shows a top view of the mark in FIG. 1A and a sectional view of a part of another display substrate along the section line z-z' in FIG. 1A, according to some embodiments.
Figure 2C:
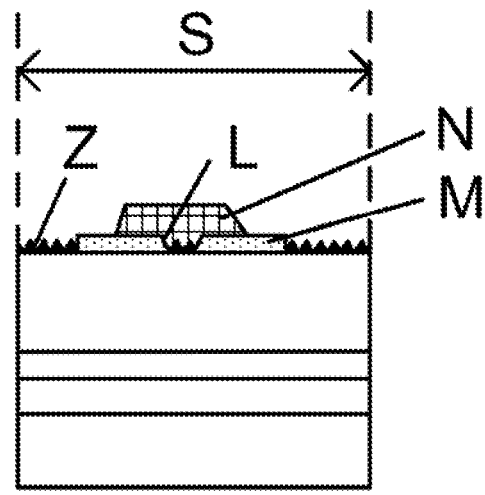
FIG. 2C shows a sectional view of a part of yet another display substrate along the section line z-z' in FIG. 1A, according to some embodiments.

In some embodiments, as shown in FIG. 2C, the surface of the first insulating layer 15 facing away from the base 11 has a concave-convex structure Z. The concave-convex structure Z may increase the adhesion between the second alignment pattern N and the first insulating layer 15, thereby preventing the second alignment pattern N from detaching.

For example, the concave-convex structure Z is formed in the surface of the first insulating layer 15 facing away from the base 11 through an ashing process (i.e., a process for increasing the roughness of the surface of the first insulating layer).

The position relationship between the second alignment pattern N and the the first alignment pattern M at least has the following implementations.

In some implementations, as shown in FIG. 2A, the second alignment pattern N covers the surface of the first alignment pattern M facing away from the base 11 and at least one side face of the first alignment pattern M, and the orthographic projection of the first alignment pattern M on the base 11 is in a range of the orthographic projection of the second alignment pattern N on the base 11.

In this case, the orthographic projection of the second alignment pattern N on the base 11 and the orthographic projection of the first alignment pattern M on the base 11 have the non-overlapping region at the at least one side face of the first alignment pattern M. The at least one side face may include one side face when the first alignment pattern M has a rounded shape, or may include four side faces when the first alignment pattern has a rectangular shape.

In some other implementations, as shown in FIGS. 2B to 2E and FIG. 2H, the first alignment pattern M includes a first via hole L, and the second alignment pattern N is in contact with the first insulating layer 15 through the first via hole L. In this case, the non-overlapping region between the orthographic projection of the second alignment pattern N on the base 11 and the orthographic projection of the first alignment pattern M on the base 11 include at least the region where the first via hole L is located.

FIGS. 2B to 2E and FIG. 2H only illustrate a case where the first alignment pattern M includes one first via hole L, and it will be understood that the first alignment pattern M may include a plurality of first via holes L, through which the second alignment pattern N is in contact with the first insulating layer 15. In addition, the first via hole L may have multiple shapes, such as a rounded shape, a rectangular shape, or an annular shape.

Figure 2D:
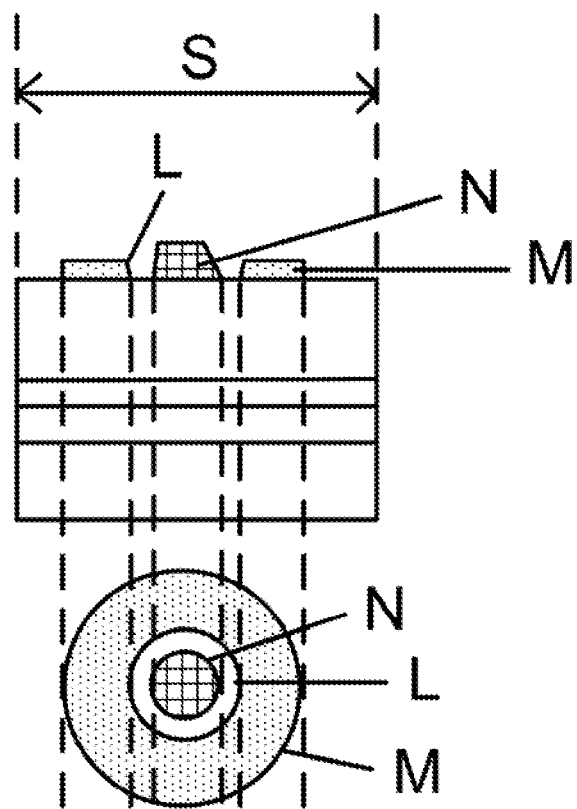
FIG. 2D shows a top view of the mark in FIG. 1A and a sectional view of a part of yet another display substrate along the section line z-z' in FIG. 1A, according to some embodiments.
Figure 2E:
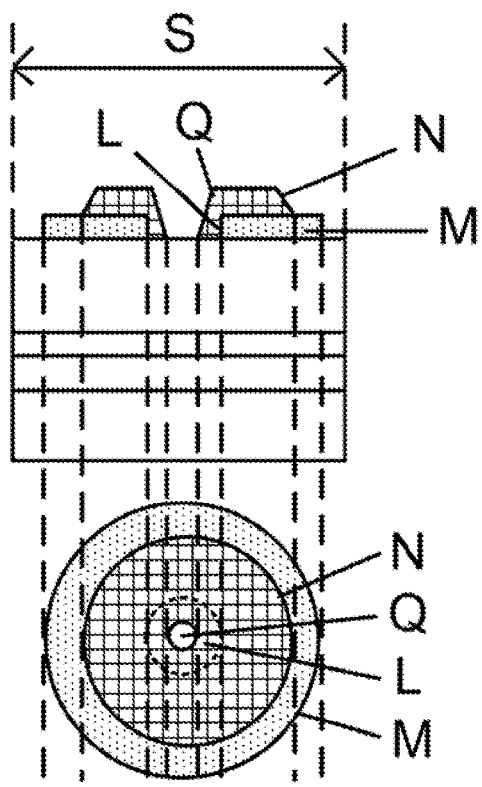
FIG. 2E shows a top view of the mark in FIG. 1A and a sectional view of a part of yet another display substrate along the section line z-z' in FIG. 1A, according to some embodiments.
Figure 2F:
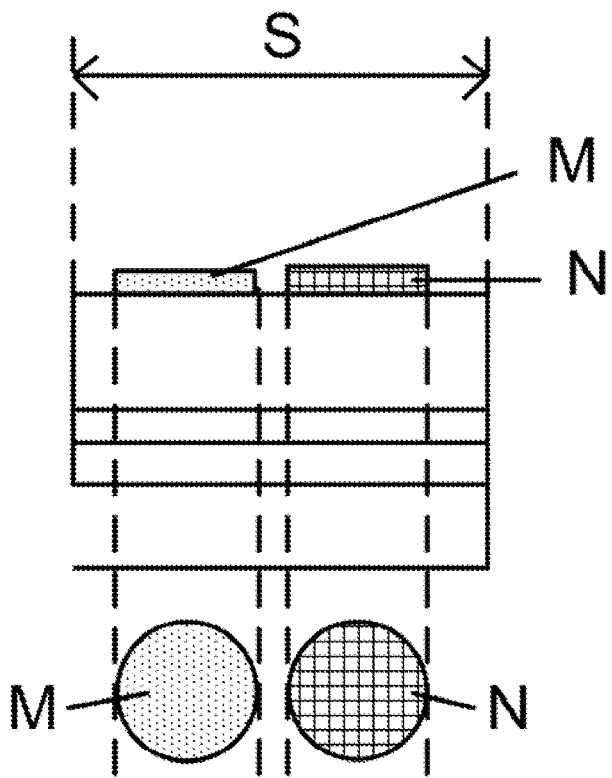
FIG. 2F shows a top view of the mark in FIG. 1A and a sectional view of a part of yet another display substrate along the section line z-z' in FIG. 1A, according to some embodiments.
Figure 2G:
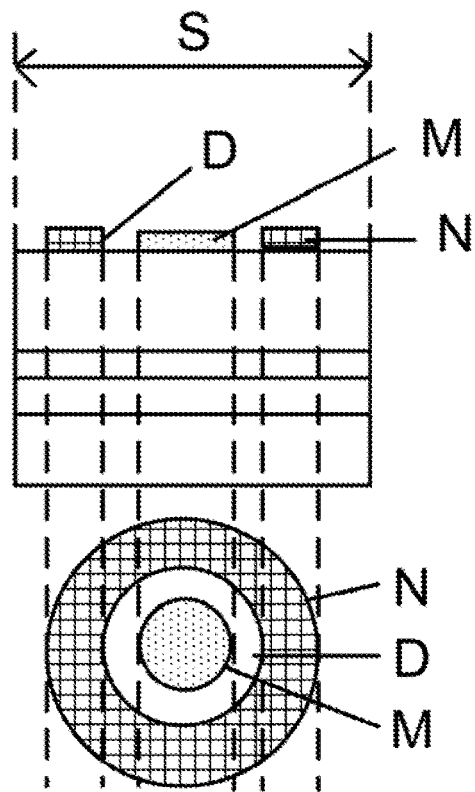
FIG. 2G shows a top view of the mark In FIG. 1A and a sectional view of a part of yet another display substrate along the section line z-z' in FIG. 1A, according to some embodiments.
Figure 2H:
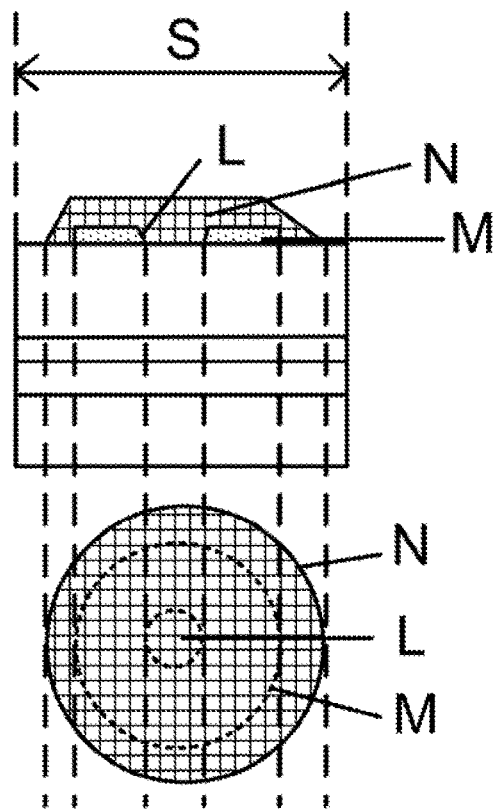
FIG. 2H shows a top view of the mark in FIG. 1A and a sectional view of a part of yet another display substrate along the section line z-z' in FIG. 1A, according to some embodiments.

In some examples, as shown in FIG. 2H, an outer boundary of the orthographic projection of the first alignment pattern M on the base 11 is within an outer boundary of the orthographic projection of the second alignment pattern N on the base 11.

Herein, as shown in FIGS. 2B to 2H, "an outer boundary of an orthographic projection on the base 11" refers to an outermost boundary of at least one boundary of the orthographic projection on the base 11.

In some other examples, an outer boundary of the orthographic projection of the second alignment pattern N on the base 11 substantially overlaps with an outer boundary of the orthographic projection of the first alignment pattern M on the base 11.

In some other examples, the outer boundary of the orthographic projection of the second alignment pattern N on the base 11 is within a range of the outer boundary of an orthographic projection of the first alignment pattern M on the base 11. For example, as shown in FIGS. 2B to 2E, the outer boundary of the orthographic projection of the second alignment pattern N on the base 11 is within the range of the outer boundary of the orthographic projection of the first alignment pattern M on the base 11.

In the case where the outer boundary of the orthographic projection of the second alignment pattern N on the base 11 is within the range of the outer boundary of the orthographic projection of the first alignment pattern M on the base 11, the second alignment pattern N and the first alignment pattern M may have the following exemplary arrangements.

For example, as shown in FIGS. 2B and 2C, the second alignment pattern N is disposed on the surface of the first alignment pattern M facing away from the base 11, and the outer boundary of the orthographic projection of the second alignment patter N on the base 11 is between an outer boundary of an orthographic projection of the first via hole L on the base 11 and the outer boundary of the orthographic projection of the first alignment pattern M on the base 11.

For another example, the second alignment pattern N is disposed on a surface of the first insulating layer 15 facing away from the base 11. The outer boundary of the orthographic projection of the second alignment pattern N on the base 11 substantially overlaps with the outer boundary of the orthographic projection of the first via hole L on the base 11 or is within a range of the orthographic projection of the first via hole L on the base 11. For example, as shown in FIG. 2D, the outer boundary of the orthographic projection of the second alignment pattern N on the base 11 is within the range of the orthographic projection of the first via hole L on the base 11.

For another example, as shown in FIG. 2E, the second alignment pattern N includes a third via hole Q, and an orthographic projection of the third via hole Q on the base 11 is within the range of the orthographic projection of the first via hole L on the base 11. In this case, the second alignment pattern N may be in contact with the first insulating layer 15 in the region between the first via hole L and the third via hole Q.

In some other implementations, the second alignment pattern N includes a fourth via hole D, and the first alignment pattern M is disposed in the fourth via hole D. In this case, the entire second alignment pattern N is in contact with the first insulating layer 15 through the fourth via hole D.

For example, as shown in FIG. 2G, the first alignment pattern M is in the fourth via hole D and is not in contact with the second alignment pattern N. For another example, the first alignment pattern M is in the fourth via hole D and is just in contact with the second alignment pattern N.

In some other implementations, the second alignment pattern N is disposed on the surface of the first insulating layer 15 facing away from the base 11, and the second alignment patter N and the first alignment pattern M has a gap therebetween. In this case, the entire second alignment pattern N is in contact with the first insulating layer 15.

For example, as shown in FIG. 2D, the first alignment pattern M surrounds the second alignment pattern N. For another example, as shown in FIG. 2F, the second alignment pattern N and the first alignment pattern M are provided separately, and the orthographic projection of the second alignment pattern N on the base 11 is outside the range of the orthographic projection of the first alignment pattern M on the base 11. For yet another example, as shown in FIG. 2G, the second alignment patter N surrounds the first alignment pattern M.

In some embodiments, a material of the second alignment pattern N is the same as a material of the first insulating layer 15, or they belong to the same kind of material. In this way, the adhesion between the second alignment patter N and the first insulating layer 15 may be increased, thereby preventing the second alignment pattern N from detaching. Furthermore, the problem that the second alignment pattern N detaches and shields the pixel opening region and then the pixel opening region becomes smaller is solved.

In some examples, the material of the second alignment pattern N and the material of the first insulating layer 15 may include or may be organic materials, inorganic materials or mixed materials of organic and inorganic materials. For example, the material of the second alignment pattern N and the material of the first insulating layer 15 are both organic materials, such as polyimide. Polyimide is a class of polymers containing imide groups ($-CO-NH-CO-$) in the main chain. For another example, the material of the second alignment pattern N and the material of the first insulating layer 15 are both polymethyl methacrylate (PMMA).

In some embodiments, as shown in FIG. 1B, the display substrate 1 further includes a first electrodes 131 located in the display area A. The first electrode 131 and the first alignment pattern M are disposed in a same layer, and a material of the first electrode 131 is the same as a material of the first alignment pattern M.

FIG. 1B schematically illustrate one first electrode 131. It will be understood that the display substrate 1 may include a first electrode layer, and the first electrode layer may include a plurality of first electrodes 131. The structure of the first electrode is not limited thereto, and can be set according to actual needs.

In some embodiments, as shown in FIG. 1B, the display substrate 1 further includes a second insulating layer 14. The second insulating layer 14 and the second alignment pattern N are disposed in a same layer, and a material of the second insulating layer 14 is the same as a material of the second alignment pattern N.

During a manufacturing process of the display substrate 1, the first electrode 131 and the first alignment pattern M may be formed through a first patterning process, and the second insulating layer 14 and the second alignment patter N may be formed through a second patterning process. During the process of forming the second insulating layer 14 and the second alignment pattern N, the first alignment pattern M serves as an alignment mark to achieve alignment between the second insulating layer 14 and the first electrode 131. After the second insulating layer 14 and the second alignment pattern N are formed, the second alignment pattern N serves as an alignment mark to achieve alignment between the subsequently formed layers (such as a light-emitting functional layer) and the second insulating layer 14.

Herein, the description "disposed in a same layer" may mean that a layer used to form specific patterns is formed by a film forming process first, and then the specific patterns are formed by one patterning process using a mask. Depending on different specific patterns, the patterning process may include one or more of exposure processes, development processes or etching processes. The formed specific patterns may be continuous or discontinuous, and these specific patterns may be at different heights or have different thicknesses. For example, in the embodiments of the present disclosure, a plurality of components/elements may be disposed in the same layer, so that the number of the formed layers may not be increased, which is beneficial to reducing a thickness of the display panel and simplifying the manufacturing process.

Figure 4:
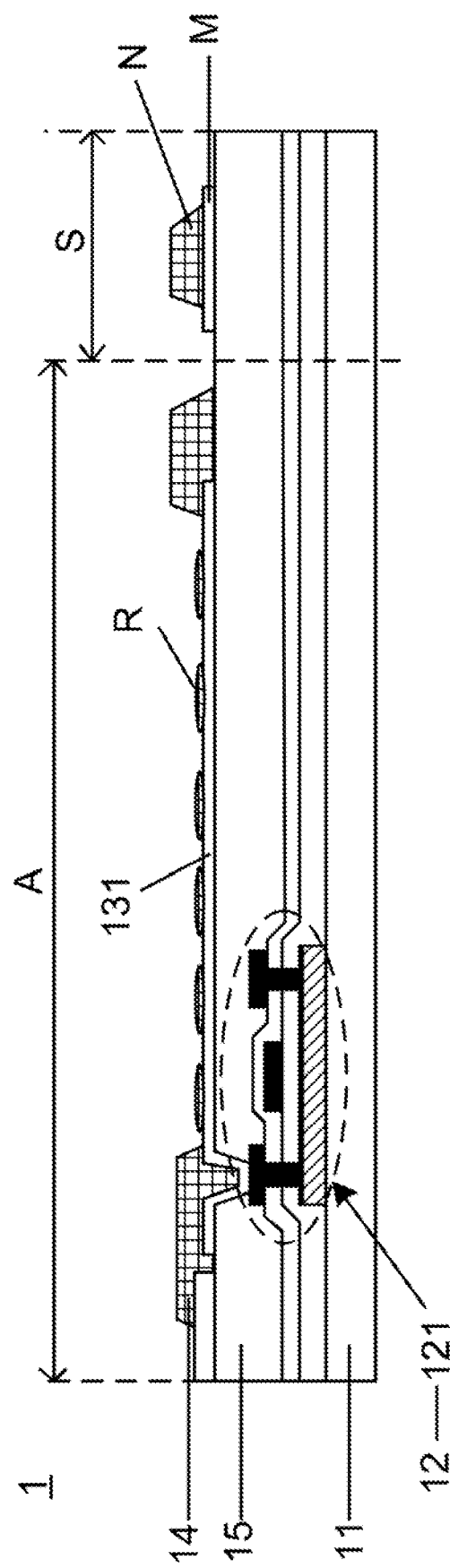
FIG. 4 is a sectional view of another display substrate along the section line z-z' in FIG. 1A.

As shown in FIGS. 3 and 4, in order to prevent the second alignment pattern N from detaching, during a process of forming the first electrode 131 and the first alignment pattern M, an adhesive is usually coated on a surface thereof facing away from the base 11 to increase the adhesion between the first alignment pattern M and the subsequently formed second alignment pattern N. However, during the second patterning process of forming the second insulating layer 14, due to the adhesion of a part of the adhesive remaining on the first electrode 131, as shown in FIG. 4, residual portions R of the second insulating layer 14 will remain on the first electrode 131, which may cause the resistance between the first electrode 131 and a second electrode in the display panel to increase, and thus power consumption may be increased.

In the embodiments of the present disclosure, at least part of the second alignment pattern N is in contact with the first insulating layer 15. In this way, it is possible to prevent the second alignment pattern N from detaching without coating adhesive on the surface of the first electrode 131 facing away from the base 11 and the surface of the first alignment pattern M facing away from the base 11. As a result, the problem that the resistance between the first electrode 131 and the second electrode is increased and the power consumption is increased due to coating the adhesive may be solved.

In some embodiments, the display substrate 1 is an array substrate in a liquid crystal display device, the first insulating layer 15 is a gate insulating layer, the first electrode 131 is a pixel electrode, and the second insulating layer 14 is a protection layer.

In some embodiments, the display substrate 1 is a base substrate in an OLED display device, the first insulating layer 15 is a planarization layer, and the second insulating layer 14 is a pixel defining layer. In some examples, the first electrode 131 is an anode. In some other examples, the first electrode 131 is a cathode. The first electrode 131 can be designed according to actual requirements.

In some examples, as shown in FIG. 18, the second insulating layer 14 is the pixel defining layer, the second insulating layer 14 includes a plurality of openings 134, and each opening 134 corresponds to one first electrode 131. That is, an orthographic projection of the opening 134 on the base 11 overlaps with an orthographic projection of the first electrode 131 on the base 11.

In an example where the display substrate is an electroluminescence display substrate, as shown in FIG. 18, the display substrate includes a plurality of light-emitting devices 13, each light-emitting device 13 includes a first electrode 131 and a second electrode 132, and the first electrode 131 is disposed between the base 11 and the second electrode 132. In a case where the light-emitting device 13 is a top emission light-emitting device, the first electrode 131 may be an anode and the second electrode 132 may be a cathode. The first electrode 131 may be transparent, and be made of ITO (Indium Tin Oxides). The second electrode 132 may be transparent or translucent. In this case, the second electrode 132 may be made of metal (for example, silver (Ag)) and its thickness is very thin. In some other examples, the first electrode 131 may be opaque, and have a layered structure of Indium Tin Oxides composed of an ITO layer, Ag layer and an ITO layer stacked, for example.

With continuous reference to FIG. 1B, the light-emitting device 13 may further include a light-emitting functional layer 133 between the first electrode 131 and the second electrode 132. In some examples, the light-emitting functional layer 133 includes a light-emitting layer. In some other examples, in addition to the light-emitting layer, the light-emitting functional layer 133 further includes at least one of an electron transport layer (ETL), an electron injection layer (EIL), a hole transport layer (HTL), or a hole injection layer (HIL).

In some embodiments, as shown in FIG. 1B, the display substrate 1 further includes at least one pixel driving circuit 12 located in the display area A between the base 11 and the first insulating layer 15. The first insulating layer 15 includes at least one second via hole O, and each pixel driving circuit 12 is electrically connected to a corresponding first electrode 131 through at least one second via hole O.

As shown in FIG. 1B, the pixel driving circuit 12 may include a TFT driving circuit 121 and a capacitor. The TFT driving circuit 121 includes a plurality of transistors, and one of the plurality of transistors is a driving transistor. A drain of the driving transistor is electrically connected to the first electrode 131 of the light-emitting device 13.

For example, the TFT driving circuit 121 and the capacitor constitute the pixel driving circuit 12 used for driving the light-emitting device 13 to emit light. In this case, no matter how the capacitor and the TFT driving circuit 121 in the pixel driving circuit are arranged, the capacitor must be electrically connected to the TFT driving circuit 121.

Figure 5:
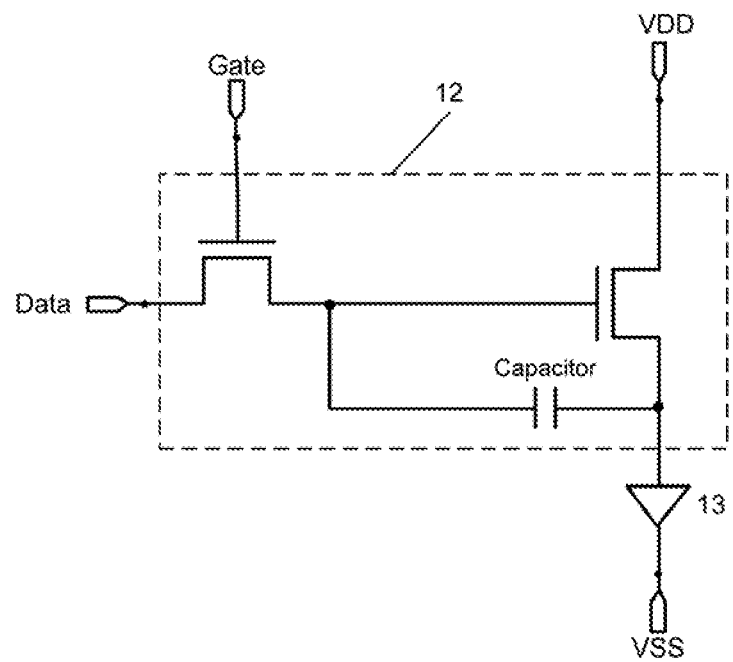
FIG. 5 is an equivalent circuit diagram of a pixel driving circuit in a display substrate, according to some embodiments.

For example, the pixel driving circuit 12 may be a driving circuit with a 2T1C structure, that is, the driving circuit includes two transistors and one capacitor. An equivalent circuit diagram of the pixel driving circuit and the light-emitting device 13 is shown in FIG. 5. Of course, the structure of the pixel driving circuit 12 is not limited thereto, and can be set according to actual needs.

Figure 6:
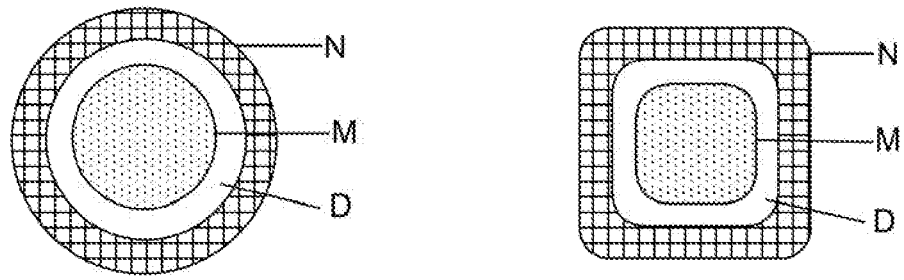
FIG. 6 shows top views of a first alignment pattern and a second alignment pattern, according to some embodiments.
Figure 7:
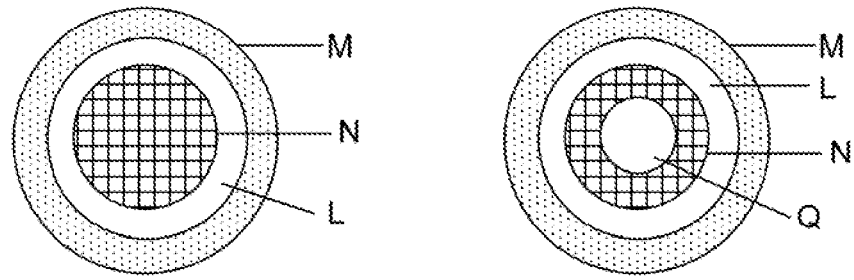
FIG. 7 shows top views of another first alignment pattern and another second alignment pattern, according to some embodiments.
Figure 8:
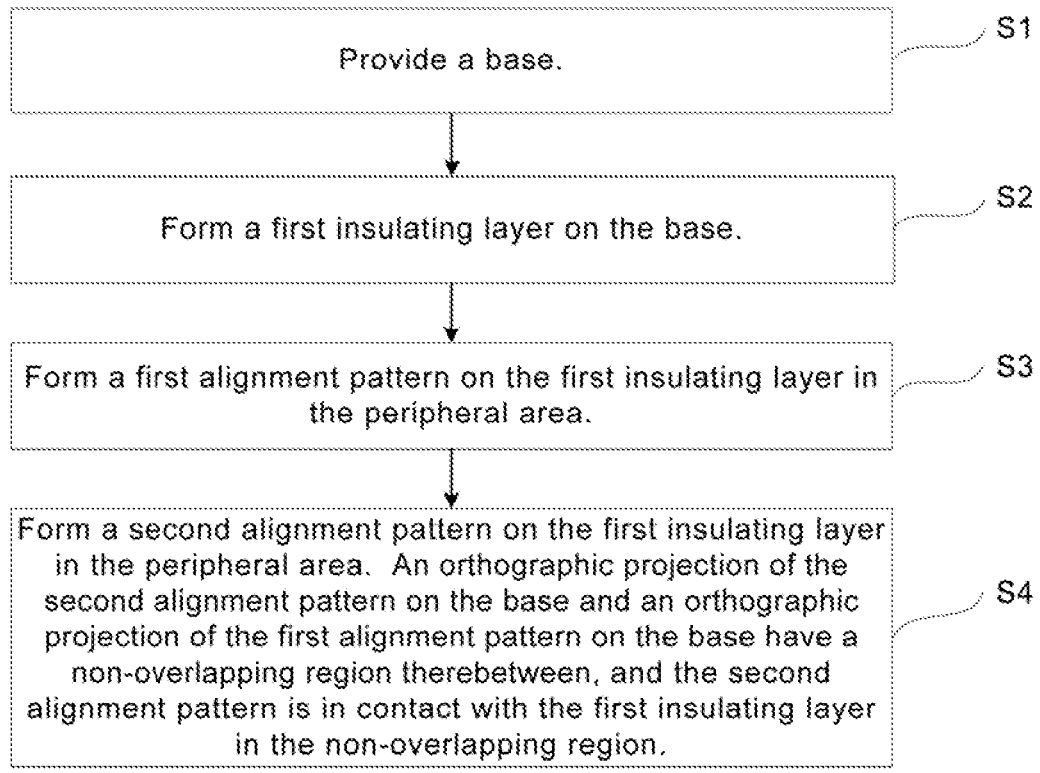
FIG. 8 is a flow chart of a method of manufacturing a display substrate, according to some embodiments.

In some embodiments, the orthographic projection of the second alignment pattern N on the base 11 do not overlap with the orthographic projection of the first alignment pattern M on the base 11. For example, as shown in FIG. 6, the orthographic projection of the second alignment pattern N on the base 11 surrounds the orthographic projection of the first alignment pattern M on the base 11. For another example, as shown in FIG. 7, the orthographic projection of the first alignment pattern M on the base 11 surrounds the orthographic projection of the second alignment pattern N on the base 11.

Figure 9:
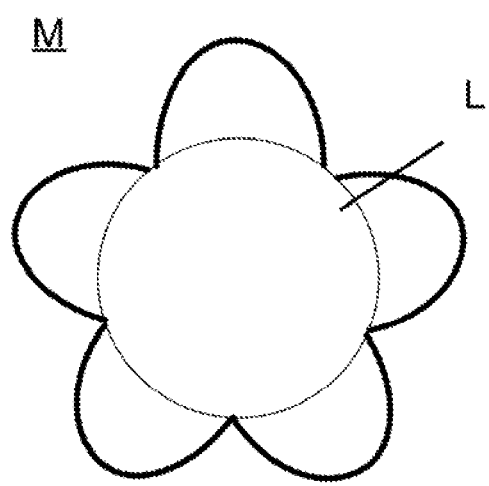
FIG. 9 is a top view of a first alignment pattern, according to some embodiments.
Figure 10:
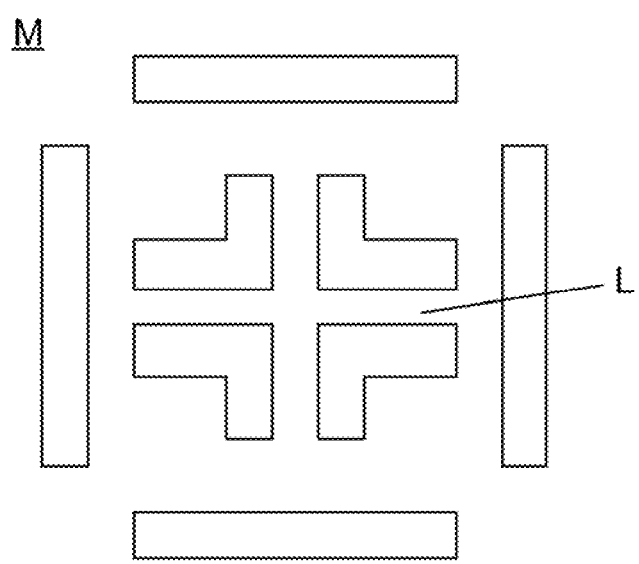
FIG. 10 is a top view of another first alignment pattern, according to some embodiments.

The shapes of the first alignment pattern M and the second alignment pattern N are not limited herein, as long as the patterns meet actual needs. As shown in FIGS. 6 and 7, the shape of the first alignment pattern M is, for example, a circle, a square or a ring, and the shape of the second alignment pattern N is, for example, a circle, a square or a ring. In some other examples, as shown in FIG. 9, the shape of the first alignment pattern M is a petal; or, as shown in FIG. 10, the shape of the first alignment pattern M is irregular.

It will be noted that, with regard to beneficial effects of the display panel 01, reference may be made to the related contents of the display substrate 1 provided in the foregoing embodiments.

Some embodiments of the present disclosure provide a method of manufacturing the display substrate 1. As shown in FIG. 18, FIGS. 2A to 2H and FIG. 8, the method includes S1 to S4.

In S1, a base 11 is provided.

In S2, a first insulating layer 15 is formed on the base 11.

In S3, a first alignment pattern M is formed in the peripheral area S on the first insulating layer 15.

In S4, a second alignment pattern N is formed in the peripheral area S on the first insulating layer 15. The orthographic projection of the second alignment pattern N on the base 11 and the orthographic projection of the first alignment pattern M on the base 11 have a non-overlapping region therebetween, the second alignment pattern N is in contact with the first insulating layer 15 in the non-overlapping region, and the adhesion between the second alignment pattern N and the first insulating layer 15 is greater than the adhesion between the second alignment pattern N and the first alignment pattern M.

In this way, the second alignment pattern N in the display substrate 1 manufactured by the method is not easy to detach.

In some embodiments, the material of the second alignment pattern N is the same as the material of the first insulating layer 15, or they belong to the same kind of material. In this way, the adhesion between the second alignment pattern N and the first insulating layer 15 may be increased, thereby preventing the second alignment pattern N from detaching. Furthermore, the problem that the second alignment pattern N detaches and shields the pixel opening region and then the pixel opening region becomes smaller may be solved.

For example, the material of the second alignment pattern N and the material of the first insulating layer 15 may include or may be organic materials, inorganic materials or mixed materials of organic and inorganic materials. In some examples, the material of the second alignment pattern N and the material of the first insulating layer 15 are both organic materials, such as polyimide. Polyimide is a class of polymers containing imide groups (—CO—NH—CO—) in the main chain. In some examples, the material of the second alignment pattern N and the material of the first insulating layer 15 are both PMMA.

In some embodiments, after the first alignment pattern M is formed, the method further includes S31.

In S31, a first via hole L is formed in the first alignment pattern M. In this way, the second alignment pattern N formed in S4 can be in contact with the first insulating layer 15 through the first via hole L.

In some embodiments, after the second alignment pattern N is formed, the method further includes S41.

In S41, a third via hole Q is formed in the second alignment pattern N. An orthographic projection of the third via hole Q on the base 11 is in the range of an orthographic projection of the first via hole L on the base 11.

In some embodiments, after the first insulating layer 15 is formed on the base 11, the method further includes S21.

In S21, the first insulating layer 15 is performed an ashing process. A surface of the first insulating layer 15 obtained after performing the ashing process has a concave-convex structure Z. The concave-convex structure Z may increase the adhesion between the second alignment pattern N and the first insulating layer 15, thereby further preventing the second alignment pattern N from detaching.

In some embodiments, the S3 of the method includes: forming a first electrode 131 in the display area A and the first alignment pattern M simultaneously. The first electrode 131 and the first alignment pattern M are formed through the first patterning process.

In some embodiments, the S4 of the method includes: forming the second insulating layer 14 and the second alignment pattern N simultaneously. The second insulating layer 14 and the second alignment pattern N are formed through the second patterning process.

Herein, some embodiments are described below in detail by taking an example where the first insulating layer 15 is a planarization layer, the first alignment pattern M is an alignment mark formed together with the first electrode 131, and the second alignment pattern N is an alignment mark formed together with the second insulating layer 14.

As shown in FIG. 1B, the display substrate 1 includes a light-emitting device 13 disposed in the display area A. and a second insulating layer 14. The light-emitting device 13 includes a first electrode 131 and a second electrode 132, and the first electrode 131 is disposed between the base 11 and the second electrode 132. The first alignment pattern M and the first electrode 131 are formed through the first patterning process and made of a same material. The second alignment pattern N and the second insulating layer 14 are formed through the second patterning process and made of a same material.

At least part of the second alignment pattern N is in contact with the first insulating layer 15, and the material of the second alignment pattern N is the same as the material of the second alignment pattern N, so that the adhesion between the second alignment pattern N and the first insulating layer 15 may be increased. In this way, the second alignment patter N may be prevented from detaching, and the problem that the second alignment patter N detaches and shields the pixel opening region and then the pixel opening region becomes smaller may be solved.

In order to prevent the second alignment patter N from detaching, during a process of forming the first electrode 131 and the first alignment pattern M, an adhesive is usually coated on a surface thereof facing away from the base 11 to increase the adhesion between the first alignment pattern M and the subsequently formed second alignment pattern N. A part of the adhesive remains in the pixel opening region. As a result, in the process of forming the second insulating layer 14 through the second patterning process, due to the adhesion of the adhesive, as shown in FIG. 3, residual portions R of the second insulating layer 14 remain in the pixel opening region, which may cause the resistance between the first electrode 131 and the second electrode 132 to increase, and thus the power consumption may be increased.

In the embodiments of the present disclosure, at least part of the second alignment pattern N is in contact with the first insulating layer 15. In this way, it is possible to prevent the second alignment pattern N from detaching without coating adhesive on the surface of the first electrode 131 facing away from the base 11 and the surface of the first alignment pattern M facing away from the base 11. As a result, the problem that the resistance between the first electrode 131 and the second electrode 132 is increased and the power consumption is increased due to coating the adhesive may be solved.

Specific structures of the first alignment pattern M and the second alignment patter N can be designed according to actual requirements, and the first alignment pattern M and the second alignment pattern N may be any patterns for aligning.

It will be noted that, in the actual manufacturing process, specific structures of the first alignment pattern M and the second alignment pattern N may be formed through suitable patterning processes.

The forgoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display substrate having a display area and a peripheral area, the display substrate comprising:
   a base;
   a first insulating layer disposed above the base, wherein a surface of the first insulating layer, facing away from the base, has a concave-convex structure;
   a first alignment pattern disposed in the peripheral area on the surface of the first insulating layer facing away from the base; and
   a second alignment pattern disposed in the peripheral area at a side of the first insulating layer away from the base, wherein
   an orthographic projection of the second alignment pattern on the base and an orthographic projection of the first alignment pattern on the base have a non-overlapping region therebetween, the second alignment pattern is in contact with the first insulating layer in the non-overlapping region, and adhesion between the second alignment pattern and the first insulating layer is greater than adhesion between the second alignment pattern and the first alignment pattern.

2. The display substrate according to claim 1, wherein the first alignment pattern includes a first via hole, and the second alignment pattern is in contact with the first insulating layer through the first via hole.

3. The display substrate according to claim 2, wherein the second alignment pattern is disposed on the surface of the first insulating layer facing away from the base, and an outer boundary of the orthographic projection of the second alignment pattern on the base substantially overlaps with an outer boundary of the orthographic projection of the first alignment pattern on the base.

4. The display substrate according to claim 2, wherein the second alignment pattern is disposed on the surface of the first insulating layer facing away from the base, and an outer boundary of an orthographic projection of the second alignment pattern on the base substantially overlaps with an outer boundary of an orthographic projection of the first via hole on the base, or is within a range of the orthographic projection of the first via hole on the base.

5. The display substrate according to claim 2, wherein the second alignment pattern is disposed on a surface of the first alignment pattern facing away from the base, and an outer boundary of an orthographic projection of the second alignment pattern on the base is between a boundary of an orthographic projection of the first via hole on the base and an outer boundary of an orthographic projection of the first alignment pattern on the base.

6. The display substrate according to claim 5, wherein the second alignment pattern includes a third via hole, and an orthographic projection of the third via hole on the base is within a range of the orthographic projection of the first via hole on the base.

7. The display substrate according to claim 1, wherein the second alignment pattern covers a surface of the first alignment pattern facing away from the base and at least one side face of the first alignment pattern, and the orthographic projection of the first alignment pattern on the base is in a range of the orthographic projection of the second alignment pattern on the base.

8. The display substrate according to claim 1, wherein the second alignment pattern is disposed on the surface of the first insulating layer facing away from the base, and the second alignment pattern and the first alignment pattern has a gap therebetween.

9. The display substrate according to claim 1, wherein the second alignment pattern is disposed on the surface of the first insulating layer facing away from the base, the second alignment pattern includes a fourth via hole, and the first alignment pattern is disposed in the fourth via hole.

10. The display substrate according to claim 1, wherein a material of the second alignment pattern is the same as a material of the first insulating layer.

11. The display substrate according to claim 1, further comprising a first electrode located in the display area, wherein the first electrode and the first alignment pattern are disposed in a same layer and a material of the first electrode is the same as a material of the first alignment pattern.

12. The display substrate according to claim 11, further comprising a second insulating layer, wherein the second insulating layer and the second alignment pattern are disposed in a same layer and a material of the second insulating layer is the same as a material of the second alignment pattern.

13. The display substrate according to claim 12, wherein the second insulating layer includes an opening, and an orthographic projection of the opening on the base overlaps with an orthographic projection of the first electrode on the base.

14. The display substrate according to claim 11, further comprising a pixel driving circuit disposed in the display area between the base and the first insulating layer, wherein
   the first insulating layer includes at least one second via hole, and the pixel driving circuit is electrically connected to the first electrode through the at least one second via hole.

15. A display panel, comprising the display substrate according to claim 1.

16. A method of manufacturing a display substrate having a display area and a peripheral area, wherein the display substrate includes:
   a base;
   a first insulating layer disposed above the base;
   a first alignment pattern disposed in the peripheral area on a surface of the first insulating layer facing away from the base; and
   a second alignment pattern disposed in the peripheral area at a side of the first insulating layer away from the base,
   wherein an orthographic projection of the second alignment pattern on the base and an orthographic projection of the first alignment pattern on the base have a non-overlapping region therebetween, the second alignment pattern is in contact with the first insulating layer in the non-overlapping region, and adhesion between the second alignment pattern and the first insulating layer is greater than adhesion between the second alignment pattern and the first alignment pattern, wherein the method comprises:
 providing the base;
 forming the first insulating layer on the base, and performing an ashing process on the first insulating layer;
 forming the first alignment pattern in a peripheral area on the first insulating layer; and
 forming the second alignment pattern in the peripheral area on the first insulating layer, and wherein the orthographic projection of the second alignment pattern on the base and the orthographic projection of the first alignment pattern on the base have the non-overlapping region therebetween, the second alignment pattern is in contact with the first insulating layer in the non-overlapping region, and the adhesion between the second alignment pattern and the first insulating layer is greater than the adhesion between the second alignment pattern and the first alignment pattern.

17. The method according to claim 16, wherein after forming the first alignment pattern, the method further comprises:
 forming a first via hole in the first alignment pattern.

18. The method according to claim 16, wherein a material of the second alignment pattern is the same as a material of the first insulating layer.

\* \* \* \* \*

UNITED STATES PATENT AND TRADEMARK OFFICE
CERTIFICATE OF CORRECTION

PATENT NO. : 11,521,936 B2
APPLICATION NO. : 16/880592
DATED : December 6, 2022
INVENTOR(S) : Zhen Zhang et al.

It is certified that error appears in the above-identified patent and that said Letters Patent is hereby corrected as shown below:

On the Title Page

In Item (73), under "Assignees", in Column 1, Line 3, after "CHENGDU BOE OPTOELECTRONICS TECHNOLOGY CO., LTD." insert -- Chengdu --.

Signed and Sealed this
Thirty-first Day of January, 2023

Katherine Kelly Vidal
*Director of the United States Patent and Trademark Office*